United States Patent [19]

Dreiling

[11] 4,096,397

[45] Jun. 20, 1978

[54] OSCILLOGRAPHIC APPARATUS

[75] Inventor: James A. Dreiling, Denver, Colo.

[73] Assignee: Honeywell Inc., Minneapolis, Minn.

[21] Appl. No.: 782,517

[22] Filed: Mar. 29, 1977

[51] Int. Cl.² ............................................ H03K 5/153
[52] U.S. Cl. .................................... 307/231; 307/236; 307/268; 307/362; 328/114; 307/354
[58] Field of Search ................ 307/236, 262, 268, 269, 307/362, 354; 328/114, 150; 315/379, 360; 358/148, 180

[56] References Cited
U.S. PATENT DOCUMENTS 3,204,144  8/1965  Deavenport ........................ 315/379

Primary Examiner—John Zazworsky
Attorney, Agent, or Firm—Laurence J. Marhoefer; Lockwood D. Burton

[57] ABSTRACT

There has been provided an improved switching circuit for an oscillographic apparatus wherein a determining wave form signal is compared with a reference level signal to provide a trigger control signal. The trigger control signal, a low level signal, is selectively gated to produce a signal in response, selectively, to the negative slope comparison or the positive slope comparison. The last-mentioned signal is then used to produce a trigger signal to trigger a sweep signal generator for the oscillographic apparatus.

4 Claims, 3 Drawing Figures

OSCILLOGRAPHIC APPARATUS

BACKGROUND OF THE INVENTION

1. Field of the Invention

The present invention relates to oscillographic apparatus and, more particularly, to a control circuit for such oscillographic apparatus.

2. Description of the Prior Art

In the art relating to oscillographic apparatus, whether it be an oscillographic display device or an oscillographic recording apparatus, a sweep signal is generated to cause the beam of the oscillographic apparatus to traverse across the face of the instrument. In the oscillographic presentation of repetitive wave form input signals, it is desirable to have the sweep signal synchronized with the repetition of the input signal. To that end, a trigger signal is derived from the comparison of an event signal which may be, or is related to, the input signal. It is usual that the trigger signal is derived from a point on the positive or rising slope of the determining signal wave form. When, on occasion, it is desired to carefully analyze the input wave form, the scale of the display is expanded to the point where the time of the sweep signal is less than the period of the input signal, some of the data in the input wave form is lost. On those occasions, it has been found desirable to switch the triggering of the sweep signal from the positive slope of the determining signal to the negative slope, thus, shifting the phase of that portion of the input wave form being presented for analysis. In such systems heretofore, the switching of the input, or determining signal, between the positive and negative slope has introduced two problems. One, the switching of the high-level wave form signals introduces electromagnetic discharge noise. Two, for a fixed reference potential, the system does not respond to provide a trigger signal at the same level on the negative slope as on the positive slope, leading to inaccuracies in the resultant output display, or presentation.

SUMMARY OF THE INVENTION

It is, accordingly, an object of the present invention to provide an oscillographic apparatus which obviates those shortcomings of previous apparatus.

It is another object of the present invention to provide an improved trigger circuit for oscillographic apparatus.

It is a further object of the present invention to provide an improved trigger circuit as set forth which exhibits a low noise switching characteristic and an improved accuracy of response.

In accomplishing these and other objects, there has been provided, in accordance with the present invention, an improved switching circuit for an oscillographic apparatus wherein a determining wave form signal is compared with a reference level signal to provide a trigger control signal. The trigger control signal, a low level signal, is selectively gated to produce a signal in response, selectively, to the negative slope comparison or the positive slope comparison. The last-mentioned signal is then used to produce a trigger signal to trigger a sweep signal generator for the oscillographic apparatus.

BRIEF DESCRIPTION OF THE DRAWINGS

A better understanding of the present invention may be had from the following detailed description when read in the light of the accompanying drawings, in which.

DETAILED DESCRIPTION

Figure 1:
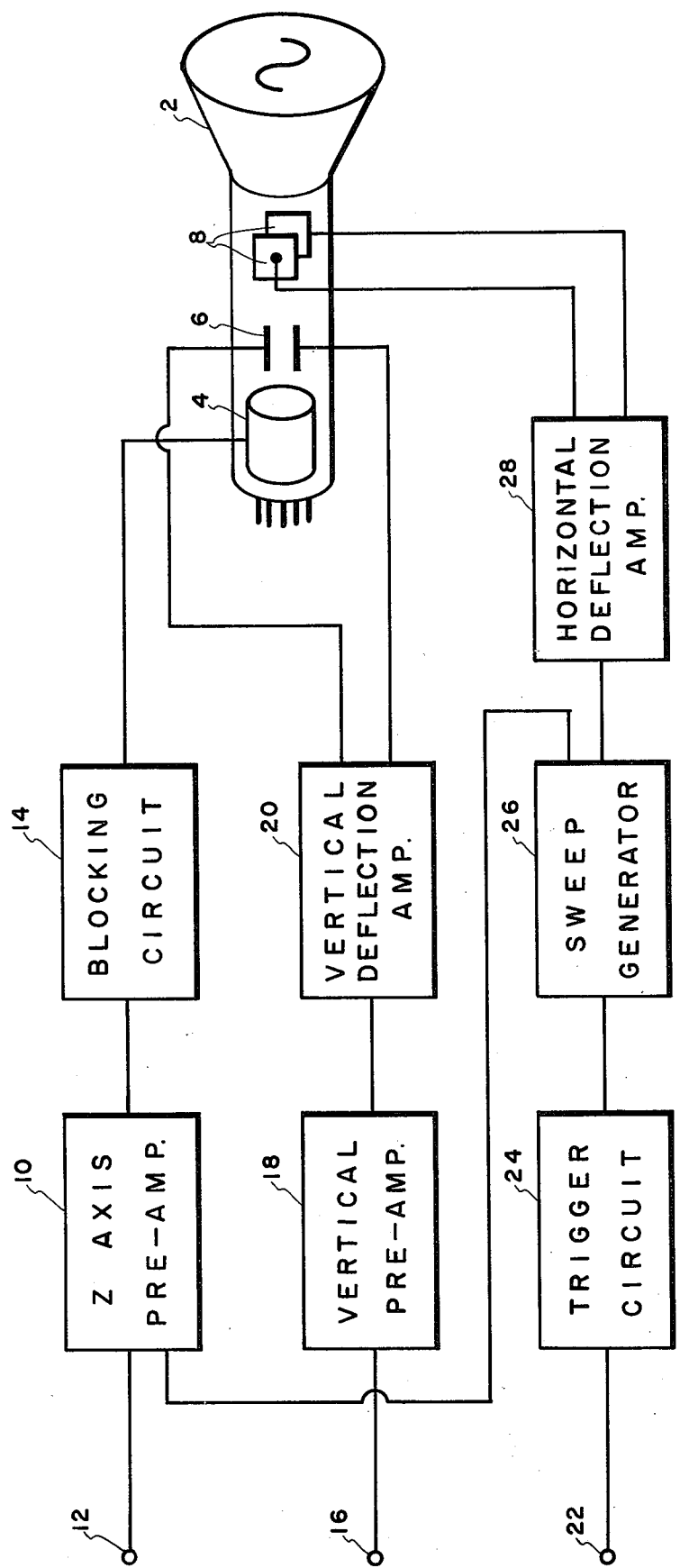
FIG. 1 is a schematic block diagram of an oscillographic apparatus embodying the present invention.

Referring, now, to the drawings in more detail, there is shown in FIG. 1 a block diagram schematic for an oscillographic display apparatus. Although the environment for the present invention is herein shown and described as an oscillographic display device, it should be understood that the invention is equally applicable to oscillographic recording devices.

A cathode ray tube 2 is provided for effecting a display. The cathode ray tube (CRT) 2 includes a cathode ray gun 4 for developing a cathode ray beam. There is also provided a pair of vertical deflection plates 6 and a pair of horizontal deflection plates 8. The structure of the cathode ray gun 4 includes means for selectively blocking the cathode ray beam. A z-axis preamplifier 10 is connected to an input terminal 12 to provide an output signal to a blocking circuit 14 which is, in turn, connected to the means in the cathode ray gun 4 for effecting the selective blocking of the beam.

A second input terminal 16 is connected to a vertical preamplifier 18, the output of which is connected to a vertical deflection amplifier 20. The output of the vertical deflection amplifier is connected to the vertical deflection plates 6 of the CRT to effect a vertical deflection of the cathode ray beam in accordance with the applied signal.

A third input terminal 22 is connected to a trigger circuit 24 the output of which is connected to a sweep signal generator 26. The output of the sweep signal generator is connected to the input of a horizontal deflection amplifier 28 the output of which is, in turn, connected to the horizontal deflection plates 8. An output of the sweep generator 26 is also applied as an input to the z-axis preamplifier 10 to synchronize the blocking of the cathode ray beam with the sweep operation of the CRT.

A signal to be displayed upon the face of the CRT is applied to the input terminal 16 of the vertical preamplifier 18. That signal is conditioned and applied to the vertical deflection amplifier 20 for application to the vertical deflection plates of the CRT to deflect the beam in a vertical direction in accordance with the instantaneous amplitude of the applied input signal. The same input signal as applied to the input terminal 16, or a signal coordinated therewith, is applied to the input terminal 22 of the trigger circuit 24. In the trigger circuit 24, the signal applied to the input terminal 22 is compared with a predetermined reference signal to produce a trigger signal which when applied to the sweep generator 26 initiates a generation of a sweep signal for the horizontal deflection of the beam in the CRT 2. The correlation of the signals applied to the input terminals 16 and 22 provides means whereby the successive cycles of the repetitive input signal may be properly superimposed one upon the other on the display face of the CRT.

Figure 2:
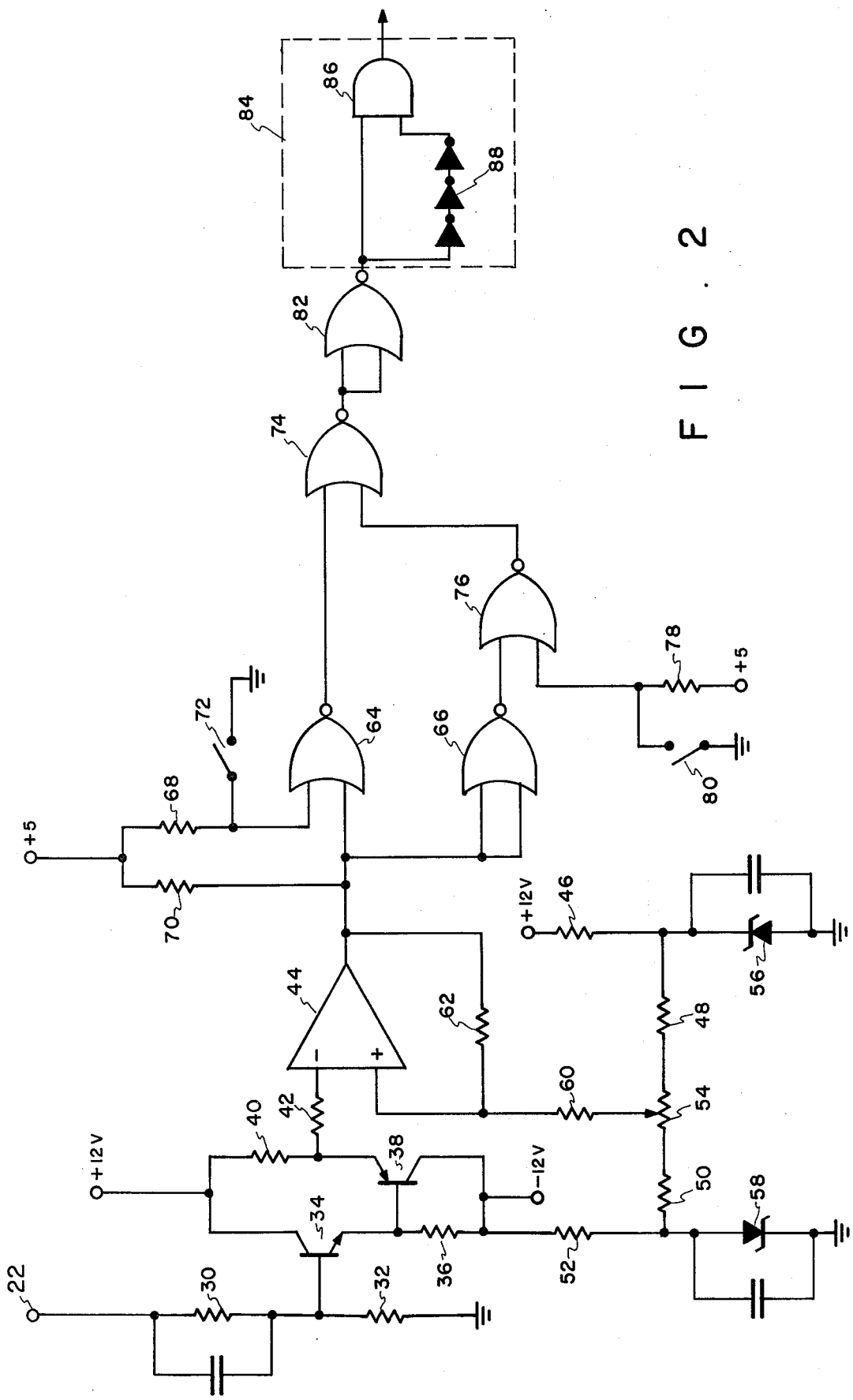
FIG. 2 is a logic diagram of a circuit illustration in the embodiment of the present invention.

In FIG. 2 there is shown a logic circuit diagram of a trigger circuit suitable for use as the trigger circuit 22 of FIG. 1 and embodying the present invention. The input terminal 22 is connected to a series string of a pair of resistors 30 and 32 the lower end of the resistor 32 being connected to ground. The two resistors 30 and 32 comprise a voltage divider the center tap of which is connected to the base electrode of a first transistor 34. The collector of the transistor 34 is connected to a positive voltage supply while the emitter is connected through a resistor 36 to a negative voltage supply. The junction between the resistor 36 and the emitter of the transistor 34 is connected to the base electrode of a second transistor 38. The collector electrode of the transistor 38 is connected to the aforementioned negative power supply while the emitter is connected through a resistor 40 to the positive power supply. The junction between the emitter of the transistor 38 and the resistor 40 is connected through a coupling resistor 42 to one input terminal of a comparator 44. A series string of fixed resistors 46, 48, 50 and 52 and a slidewire resistor 54 connected between a positive voltage supply and the aforementioned negative voltage supply terminal comprise a variable level reference signal supply. The junction between the resistors 46 and 48 is connected through a zener diode 56 to ground. Similarly, the junction between the resistors 50 and 52 is connected through a zener diode 58 to ground. These two zener diodes stabilize the reference voltage level. The slider on the slidewire resistor 54 is connected through a resistor 60 to the other input terminal of the comparator 44. A stabilizing resistor 62 is connected between the output of the comparator 44 and the second input terminal of the comparator.

The output of the comparator 44 is connected to one input terminal of a first NOR gate 64 and to both terminals of a second NOR gate or inverter 66. The second terminal of the first NOR gate 64 is connected through a resistor 68 to a logical "high" or "pull-up" reference terminal which may be, for example, a +5 volts supply. The logical "high" terminal is also connected through a resistor 70 to the output terminal of the comparator 44. A switch 72 is positioned to selectively connect the second input terminal of the NOR gate 64 to ground. The output of the NOR gate 64 is connected to one input terminal of a further NOR gate 74. The output terminal of the NOR gate 66 is connected to one input terminal of a NOR gate 76. The second terminal of the NOR gate 76 is connected through a resistor 78 to the logical "high" or 5 volt "pull-up" power supply terminal. A switch 80 is connected to the second terminal of the NOR gate 76 whereby to selectively connect that terminal to ground. The output of the NOR gate 76 is connected to a second input terminal of the NOR gate 74. The output of the NOR gate 74 is connected to both terminals of a NOR gate 82, the NOR gate 82 effectively comprising an inverter. The output of the NOR gate 82 is connected to the input of a one-shot pulse generator 84. The one-shot is shown as comprising an AND gate 86 having one input terminal connected directly to the output of the NOR gate 82. The second input terminal of the AND gate 86 is connected to the output of the NOR gate 82 through a delay line formed by a series of an odd number of inverters 88.

Figure 3:
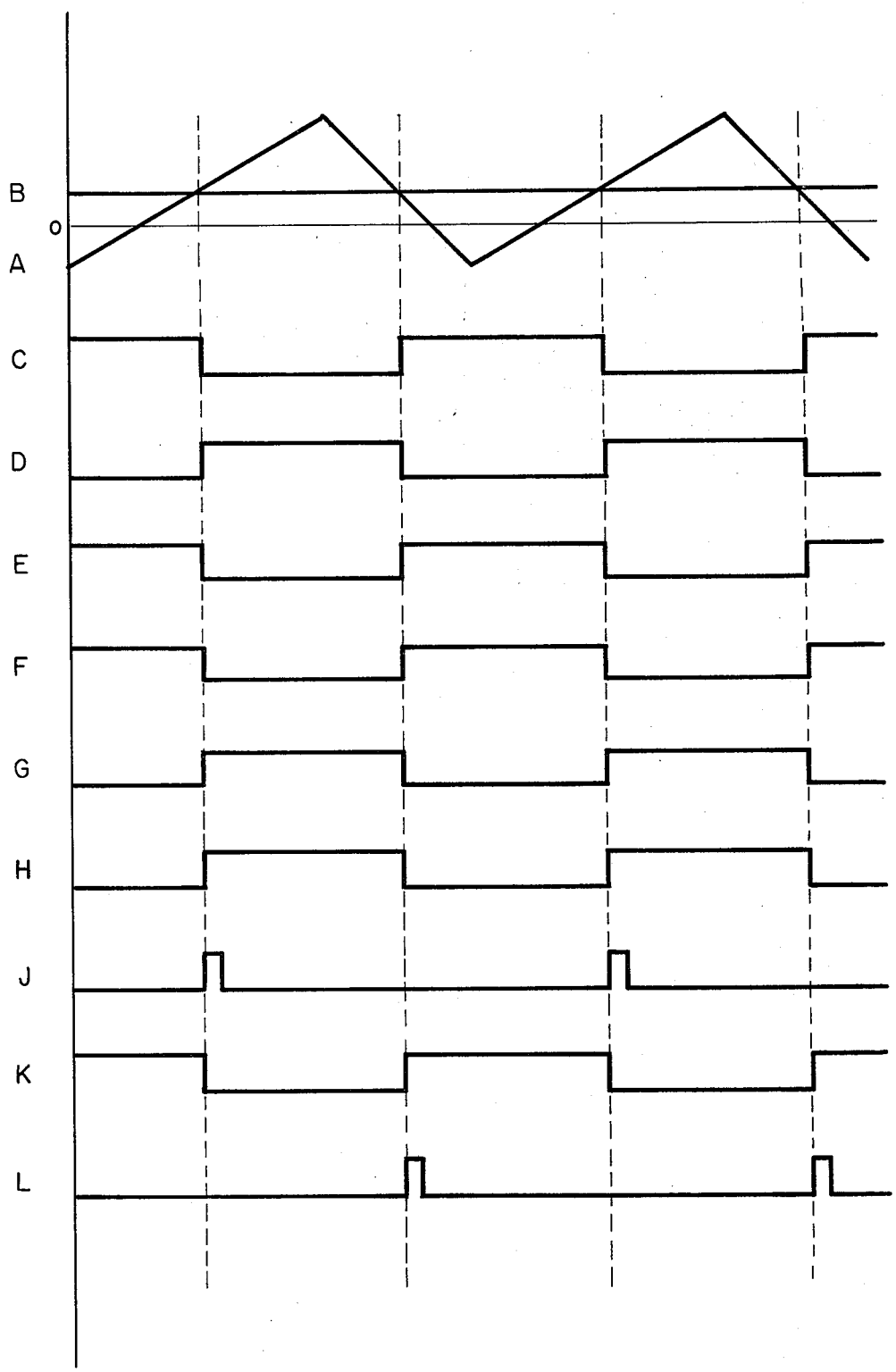
FIG. 3 is a set of curves helpful in understanding the present invention.

In operation, reference may be had also to the curves of FIG. 3 wherein curve A represents a repetitive signal which may be applied to the input terminal 22. The voltage divider comprising the resistors 30 and 32 reduces the dimension of the input signal to one suitable for use as an input signal to the voltage comparator 44. The transistors 34 and 38 are connected in a complementary emitter follower stage that has a high input impedance, a low output impedance and a low offset drift. The output of the emitter follower circuit is applied to the inverting input of the comparator 44 where it is compared with the reference signal represented by the curve B of FIG. 3. The curve C of FIG. 3 represents the output signal from the voltage comparator 44 relative to the curves A and B applied to the input terminals thereof. It may be seen that while the value of curve A is less than that of curve B the output of the comparator is at a logical "high". The logical "high" pull-up voltage supply, i.e., 5 volts, is applied through the resistor 70 to the output line of the comparator 44 to effectively clamp the output at the "high" level so long as the output of the comparator 44 is at a logical "high". That connection also clamps the first input lead of the NOR gate 64 and the inputs to the NOR gate 66 at the logical "high". At the same time, if the switch 72 is open, as shown, the second input terminal of the NOR gate 64 is also clamped at a logical "high" through the resistor 68. A logical "high" on either input terminal of the gate 64 causes a logical "low" to appear at the output terminal thereof which, in turn, produces a logical "high" at the output of the NOR gate 74. The logical "high" at the output of the gate 74 produces a logical "low" at the output of the NOR gate 82. This, in turn, holds the one-shot 84 in an off condition.

The logical "high" at the inputs of the inverter NOR gate 66 produces a logical "low" at the output thereof which is applied to one of the input terminals of the NOR gate 76. The other input terminal of the NOR gate 76 tends to be biased to the high condition from the pull-up source through the resistor 78. Again, the switch 80 is selectively operable to clamp the second input terminal of the NOR gate 76 to ground. If the switch 80 is open as shown, a logical "low" will be produced at the output of the NOR gate 76 and applied to the input of the NOR gate 74 which leaves the one-shot 84 turned off.

As will be seen, the switches 72 and 80 are so arranged that one or the other of these switches will be closed at any given time. Since with the switches both open, both of the NOR gates 64 and 76 are clamped to a low output and no signal from the output of the comparator would change that. Therefore, let it be assumed initially that the switch 72 is closed. The closure of the switch 72 clamps the second input of the NOR gate to a logical "low" or ground. With reference now to curves A and B of FIG. 3, as the value of the input signal represented by the curve A increases to the crossing point of equality with the reference signal represented by curve B, the output of the comparator will switch to a logical "low" output as shown in curve C of FIG. 3. The "low" at the output of the comparator 44 produces a "high" at the output of the NOR gate 64 and the and the NOR gate 66, as illustrated in curve D of FIG. 3. With the switch 80 open, the gate 76 has its output clamped at a logical "low". The logical "high" now appearing at the output of the gate 64 causes the output of the gate 74 to go to a logical "low", as illustrated in curve E of FIG. 3. The "low" at the output of the gate 74 forces a logical "high" at the output of the inverter gate 82, as shown in curve H. The "high" at the output of the gate 82 causes the one-shot 84 to produce a pulse at the output thereof the length of which is determined by the delay by the odd number of series connected inverters 88, as shown in curve J. That output pulse from the one-shot 84 may then be applied to the input of the sweep generator 26 (FIG. 1) to initiate a sweep signal therein.

As the input signal peaks and then begins to decline, it again reaches a crossing point of equality, on the negative slope thereof, with the reference signal represented by the curve B of FIG. 3. At that point, the output of the comparator 44 again switches to a logical "high" causing the output of the gate 64 to go to a logical "low" and the output of the gate 74 to go to a logical "high" as shown in curves C, D and E of FIG. 3. The logical "high" at the output of the gate 74 causes the output of the inverter gate 82 to go to a logical "low". That logical "low" has no effect on the output of the one-shot 84 since the delay line has already turned the gate 86 to an "off" condition. The "low" at the output of the gate 82 does have the effect, however, of applying an enabling "high" through the inverter 88 to the input of the gate 86 in readiness for the next logical "high" to appear at the output of gate 82. With the switch 80 open, the return of the output of the comparator 44 to a logical "high" does not effect the output of the gate 76 which is clamped at a logical "low" by the pull-up signal across the resistor 78. Thus, with the switch 72 closed, the response of circuit is such that an output pulse from the one-shot 84 is produced when the rising or positive slope of the input curve crosses the reference signal level.

Now let it be assumed that the switch 72 is open and the switch 80 is closed. When the input signal represented by curve A of FIG. 3 is lower in value than the reference signal of curve B, the output of the comparator is, again, at a logical "high". That logical "high" has no effect on the output of the gate 64 which is clamped to a logical "low" output by the pull-up bias applied through the resistor 68. The "high" input to the gate 66 produces a logical "low" at the output thereof, also as represented in curve D of FIG. 3. That "low" applied to the input of the gate 76 produces a logical "high" at the output thereof, as shown in curve F of FIG. 3. The other input terminal of the gate 76 is clamped to a logical "low" by the closure of the switch 80. The subsisting logical "high" at the output of the gate 76 applied to the input of the gate 76 produces a logical "low" at the output thereof, as shown in curve G of FIG. 3. That subsisting "low" at the output of gate 74 is, in turn, expressed as a corresponding "high" at the output of the gate 82, as shown in curve K of FIG. 3. That subsisting "high" at the output of the inverting gate 82 does not effect a "high" output signal from the one-shot 84 since the AND gate 86 had previously been returned to the "off" or "low" output state by the odd number of inverters 88 as shown in curve L of FIG. 3.

As the value of the input signal increases, as represented in curve A to a point of equality with the value of the reference signal represented by curve B, the output of the comparator 44 switches to a logical "low" (curve C). That "low" does not effect a change in the output of the gate 64 since the output of that gate is clamped "low" by the pull-up bias applied through the resistor 68. The switch to "low" at the output of the comparator 44 is inverted by the gate 66 (curve D) to produce a high at the input of the gate 76. The output of the gate 76 goes to a logical "low" (curve F) to produce a logical "high" at the output of the gate 74 (curve G). That "high" is inverted by the gate 82 (curve K) to produce a logical "low" at the input of the one-shot 84. That "low" does not change the output of the one-shot 84. However, after the delay introduced by the inverters 88, it does produce an enabling signal at the second input of the AND gate 86 in readiness for the next occurring "high" input signal to the one-shot 84.

As the input signal continues to increase and peak then decrease on the negative slope thereof, it again crosses the value of the reference level signal. At that crossing point, the output of the comparator again goes to a logical "high" which is inverted by the gate 66 to produce a logical "low" to the input of the gate 76. That, in turn, produces a logical "high" at the output of the gate 76, resulting in a logical "low" at the output of the gate 74. That logical "low" at the output of the gate 74 is inverted by the gate 82 to produce a logical "high" at the input of the one-shot 84. That "high" at the input of the one-shot 84 initiates the operation of the one-shot to produce an output pulse of duration determined by the delay introduced by the inverters 88 as seen in curve L of the FIG. 3. Thus, with switch 72 open and the switch 80 closed an output pulse is produced by the one-shot 84 on the occurrence of equality between the reference signal and the negative slope of the input signal.

It should be noted that the input signal, which may be a high level alternating signal, is not switched at any time. The switching of the high level alternating signal would tend to produce undesirable noise complements. Instead, the only switching necessary to effect a transfer of the timing of the trigger pulse from the positive slope to the negative slope is the switching of the low level, 5 volts, pull-up bias voltage. The switching of that signal will not produce the noise signals. By switching at the output of the comparator, the responsiveness of the system to switch accurately at substantially the same reference level on both the positive and negative slopes of the input signal is enhanced.

Thus, there has been provided an improved trigger circuit for triggering the sweep signal generator of an oscillographic apparatus.

The embodiments of an invention in which an exclusive property or privilege is claimed are defined as follows:

1. A trigger circuit comprising:
   means for producing a stable reference signal;
   comparator means for comparing a repetitive wave form input signal with said reference signal;
   said comparator means being responsive to such comparison to produce a comparator output signal which changes state in a first direction whenever the value of said input signal crosses the value of said reference signal on a positive slope of said input signal and in an opposite direction whenever the value of said input signal crosses the value of said reference signal on a negative slope of said input signal;
   a pulse generator means for producing an output trigger pulse;
   a first selectively enabled gating means responsive to said change of state of said comparator output signal in said first direction;
   a second selectively enabled gating means responsive to said change of state of said comparator output signal in said opposite direction; and means connecting the output of a selected one of said selectively enabled gating means to the input of said pulse generator means to initiate the operation thereof.

2. A trigger circuit comprising:
means for producing a stable reference signal;
comparator means for comparing a repetitive wave form input signal with said reference signal;
said comparator means being responsive to such comparison to produce a comparator output signal which changes state in a first direction whenever the value of said input signal crosses the value of said reference signal on a positive slope of said input signal and in an opposite direction whenever the value of said input signal crosses the value of said reference signal on a negative slope of said input signal;
a pulse generator means for producing an output trigger pulse;
a first selectively enabled gating means responsive to said change of state of said comparator output signal in said first direction;
a second selectively enabled gating means responsive to said change of state of said comparator output signal in said second direction;
switch means for selectively enabling one or the other of said gating means; and
means connecting the output of the selected one of said gating means to the input of said pulse generator means to initiate the operation thereof.

3. A trigger circuit comprising:
means for producing a stable reference signal;
comparator means for comparing a repetitive wave form input signal with said reference signal;
said comparator means being responsive to such comparison to produce a comparator output signal which changes state in a first direction whenever the value of said input signal crosses the value of said reference signal on a positive slope of said input signal and in an opposite direction whenever the value of said input signal crosses the value of said reference signal on a negative slope of said input signal;
a one-shot pulse generator means for producing an output trigger pulse in response to an applied initiating signal;
a first NOR gate having a first and a second input terminal, means connecting said first terminal to the output of said comparator means, means connecting a pull-up bias voltage means to said second input terminal, and a first selectively operable switch means connected between said second terminal and ground for selectively enabling said first NOR gate;
a second NOR gate having a first and a second input terminal, an inverter means connecting said first input terminal to said output of said comparator means, means connecting a pull-up bias voltage means to said second input terminal, and a second selectively operable switch means connected between said second input terminal of said second NOR gate and ground for selectively enabling said second NOR gate;
said first NOR gate being responsive, when enabled, to said change of state of said comparator output signal in said first direction, said second NOR gate being responsive, when enabled to said change of state of said comparator output signal in said opposite direction; and
means connecting the output of a selected one of said selectively enabled NOR gates to the input of said one-shot pulse generator means as an initiating signal therefor.

4. A trigger circuit comprising:
a signal input terminal for connection to a source of repetitive wave form input signals;
a voltage divider network connected between said signal input terminal and ground;
a comparator means having a first and a second input terminal;
an emitter follower buffer amplifier connected between said voltage divider network and said first input terminal of said comparator means;
means for producing a selectively variable stable reference signal;
means for applying said reference signal to said second input terminal of said comparator, said comparator being operative to compare said input signal with said reference signal to produce an output signal which changes state in a first direction whenever the value of said input signal crosses the value of said reference signal on a positive slope of said input signal and in an opposite direction whenever the value of said input signal crosses the value of said reference signal on a negative slope of said input signal;
a one-shot pulse generator means for producing an output trigger pulse in response to an applied initiating signal;
a first NOR gate having a first and a second input terminal, means connecting said first input terminal of said first NOR gate to the output of said comparator means, means connecting a pull-up bias voltage means to said second input terminal of said first NOR gate, and a first selectively operable switch means connected between said second input terminal of said first NOR gate and ground for selectively enabling said first NOR gate;
a second NOR gate having a first and a second input terminal, an inverter means connecting said first input terminal of said second NOR gate to said output of said comparator means, means connecting a pull-up bias voltage means to said second input terminal of said second NOR gate, and a second selectively operable switch means connected between said second input terminal of said second NOR gate and ground for selectively enabling said second NOR gate;
and means connecting the output of a selected one of said selectively enabled NOR gates to the input of said one-shot pulse generator means;
said first NOR gate being responsive, when enabled, to said change of state of said comparator output signal in said first direction whereby to provide an initiating signal for said pulse generator means on the positive slope of said input signal, said second NOR gate being responsive, when enabled, to said change in the state of said comparator output signal in said second direction whereby to provide an initiating signal for said pulse generator means on the negative slope of said input signal.

* * * * *